(12) United States Patent
Dennehy

(10) Patent No.: US 6,571,146 B1
(45) Date of Patent: May 27, 2003

(54) METHOD FOR UPDATING FEATURE RECIPES IN A HISTORY-BASED SOLID MODEL

(75) Inventor: Thomas G. Dennehy, Bloomfield Township, MI (US)

(73) Assignee: Autodesk, Inc., San Rafael, CA (US)

(*) Notice: Subject to any disclaimer, the term of this patent is extended or adjusted under 35 U.S.C. 154(b) by 482 days.

(21) Appl. No.: 09/627,843

(22) Filed: Jul. 28, 2000

(51) Int. Cl.[7] .............................................. G06F 19/00
(52) U.S. Cl. ........................................ 700/98; 345/420
(58) Field of Search ........................... 700/98, 97, 118; 345/419, 420

(56) References Cited

U.S. PATENT DOCUMENTS

| | | | | |
|---|---|---|---|---|
| 5,859,786 A | * | 1/1999 | Klein ............................. | 703/2 |
| 6,063,128 A | * | 5/2000 | Bentley et al. ................ | 703/6 |
| 6,313,837 B1 | * | 11/2001 | Assa et al. .................. | 345/420 |
| 6,335,732 B1 | * | 1/2002 | Shaikh ....................... | 345/421 |
| 6,426,750 B1 | * | 7/2002 | Hoppe ........................ | 345/428 |
| 6,483,518 B1 | * | 11/2002 | Perry et al. ................. | 345/590 |
| 6,486,878 B1 | * | 11/2002 | Subrahmanyam et al. .. | 345/420 |

OTHER PUBLICATIONS

X. Chen et al., "On Editability of Feature–Based Design," CAD 27, 1995, 23 pgs.

J. Kripac, "A mechanism for persistently naming topological entities in history–based parametric solid models," Computer–Aided Design, 1997, 29(2):113–122.

* cited by examiner

Primary Examiner—Leo Picard
Assistant Examiner—Zoila Cabrera
(74) Attorney, Agent, or Firm—Gates & Cooper LLP

(57) ABSTRACT

A method, system, and article of manufacture for updating features. When a cross-reference (XREF) to a non-local or non-native part is encountered, a bridge node carries a reference to a base part and holds derived part edge orderings in lieu of modifying the base part itself. The bridge node is utilized to maintain cross-part dependencies without modifying the base part, and to ensure these dependencies get chased when either the reference to a non-native/non-local part is refreshed/recomputed, or an editing session on a non-native part is completed. Features of a node/part may be suppressed/excluded as a result of the interaction or combination with another node/part. When a node/part has been modified and the drawing containing the part has not been refreshed to reflect the changes in a part, the node/part is scheduled for update. The update process traverses a dependency graph for the node part to determine if any nodes that are dependent on the updated node also need to be updated. For example, a derived part may need to have certain features suppressed as a result of the changes to the base part. The bridge node may be utilized to reflect any changes to parts dependent on the XREF part. For example, if the bridge node is suppressed, the parts dependent on the bridge node or features that connect to the bridge node may also be suppressed. Accordingly, the bridge node provides a mechanism for updating parts and features without modifying the base part or derived part.

31 Claims, 10 Drawing Sheets

FIG. 9

| DATABASE ID | ARRAY OF NODES | | | |
|---|---|---|---|---|
| 374983 | NODE 4323 | NODE 5747 | NODE 2343 | ... |
| 112343 | NODE 1111 | NODE 2336 | ... | |
| 48 5743 | NODE 3132 | NODE 5111 | NODE 2948 | NODE 1132 | ... |
| 347639 | NODE 4585 | NODE 5857 | ... | |
| 834732 | NODE 3201 | NODE 9485 | NODE 3746 | ... |

METHOD FOR UPDATING FEATURE RECIPES IN A HISTORY-BASED SOLID MODEL

BACKGROUND OF THE INVENTION

1. Field of the Invention

The present invention relates generally to computer-assisted design (CAD) systems, and in particular, to a method for cell selection during feature generation in a solid modeling system.

2. Description of the Related Art

Over the last decade, designers have changed their fundamental approach to graphics design, moving from 2D drawing systems to 3D solid modeling systems. New software makes solid modeling technology available and affordable to virtually anyone.

Solid modeling is a technique that allows designers to create dimensionally accurate 3D solid models in 3D space represented within a computer, rather than traditional 2D drawings. 3D solid models include significantly more engineering data than 2D drawings, including the volume, bounding surfaces, and edges of a design.

With the graphics capabilities of today's computers, these 3D solid models may be viewed and manipulated on a monitor. In addition to providing better visualization, 3D solid models may be used to automatically produce 2D drawing views, and can be shared with manufacturing applications and the like.

Some 3D solid modeling systems generate parametric feature-based models. A parametric feature-based model is comprised of intelligent features, such as holes, fillets, chamfers, etc. The geometry of the parametric feature-based model is defined by underlying mathematical relationships (i.e., parameters) rather than by simple unrelated dimensions, which makes them easier to modify. These systems preserve design intent and manage it after every change to the model.

Moreover, these features automatically change as the model is changed. The system computes any related changes to parts of the model that are dependent on a parameter, and automatically updates the entire model when the parameter is changed. For example, a through-hole will always completely go through a specified part, even if the part's dimensions are changed to be bigger than the hole. Additionally, the geometry/volume of one part may be used to create or modify the geometry of a second part (referred to as the base or host part). The part resulting from the combination of the first part and base part is said to be derived from the first part.

Examples of derived parts include using the first part as a toolbody to perform a boolean operation (i.e., a join/union, intersect, or cut/subtract volume operation) on the base part thereby creating a combined part. A toolbody is a part (e.g., a first part) that is aligned with a base part and then used to perform a boolean operation on the base part. The combination of the base part and the toolbody in accordance with the boolean operation specified results in a combined part. Another example of a derived part includes placing an assembly feature/constraint through an occurrence of the first part, making the second part a unique variation on the first part. An assembly constraint determines how instanced parts and subassemblies are placed relative to each other. Assembly constraints reduce the degrees of freedom of each part. Accordingly, the second part is derived from and is equal to the first part with an assembly constraint (i.e., when the first part has an assembly constraint that restricts how the first part may interact with other parts).

The process of identifying dependent features on derived parts is straightforward if all base parts are native parts stored in a single drawing file. However, if a base part is either non-local (e.g., stored in an external file) or is a non-native part (e.g., a part designed using another solid modeling system/application), the process is more difficult because of the lack of access to information such as the part history graph of the base part. Such access to information is necessary in order to establish or update a connection of a derived part.

Consequently, there is a need in the art for a solid modeling system that supports non-local or non-native parts, maintains cross-part dependencies without modifying a base part, and ensures that dependencies get followed/chased when either a cross reference (XREF) of a non-native part is refreshed/recomputed, or an editing session on a non-native part is completed.

SUMMARY OF THE INVENTION

In a solid based modeler, a user may create and/or use non-native or non-local parts in a 3d solid model. Further parts may be derived from such non-native or non-local parts. Additionally, various features of the parts may connect or utilize the non-native or non-local parts.

One or more embodiments of the invention provide a method, system, and article of manufacture for updating a host drawing and features maintained within a host drawing. Non-local or non-native parts may be accessed and utilized in a drawing. For example, a part may be based on or derived from a non-local or non-native part. When a part is derived from another part, the derived part is said to be dependent on a base or host part. When a part is dependent on a non-local or non-native base part, the derived part is referred to as an orphaned part and cross references (XREF) the base part.

Information regarding such cross referenced non-local or non-native parts may not be accessible. Accordingly, when a XREF to a non-local or non-native part is encountered, a bridge node is utilized. A bridge node carries a reference to a base part and holds the derived part edge orderings (an element that provides the computation order for reconstructing a part) in lieu of modifying the base part itself. The bridge node is utilized to maintain cross-part dependencies without modifying the base part, and to ensure these dependencies get chased when either the reference to a non-native/non-local part is refreshed/recomputed, or an editing session on a non-native part is completed.

Features of a node/part may be suppressed/excluded as a result of the interaction or combination with another node/part. When a node/part has been modified and the drawing containing the part has not been refreshed to reflect the changes in a part, the node/part is scheduled for update. The update process traverses a dependency graph for the node part to determine if any nodes that are dependent on the updated node also need to be updated. For example, a derived part may need to have certain features suppressed as a result of the changes to the base part.

The bridge node may be utilized to reflect any changes to parts dependent on the XREF part. For example, if a base part or feature on a base part is suppressed/excluded, the corresponding bridge node for that feature is suppressed. Similarly, the bridge node for a base part could be suppressed if the base part's database were unloaded from memory. In any case, parts dependent on the suppressed bridge node or features that connect to the suppressed bridge node may also be suppressed. Accordingly, the bridge node provides a mechanism for updating parts and features without modifying the base part or derived part.

BRIEF DESCRIPTION OF THE DRAWINGS

Referring now to the drawings in which like reference numbers represent corresponding parts throughout:

FIG. 9 illustrates the pointer map in accordance with one or more embodiments of the invention.

DETAILED DESCRIPTION OF THE PREFERRED EMBODIMENTS

In the following description, reference is made to the accompanying drawings which form a part hereof, and which is shown, by way of illustration, an embodiment of the present invention. It is understood that other embodiments may be utilized and structural changes may be made without departing from the scope of the present invention.

Overview

The present invention is a parametric, feature-based solid modeling system that utilizes a new type of dependency graph node, a bridge node, to serve as a surrogate for parts that are stored in external files or cannot be changed locally for whatever reason. The bridge node is utilized to: (1) detect that changes have been made to the external part represented by the bridge node; and (2) precisely and efficiently identify all local part features or local assembly features that must be suppressed, unsuppressed, recomputed, or deleted in response to those changes.

Hardware and Software Environment

Figure 1:
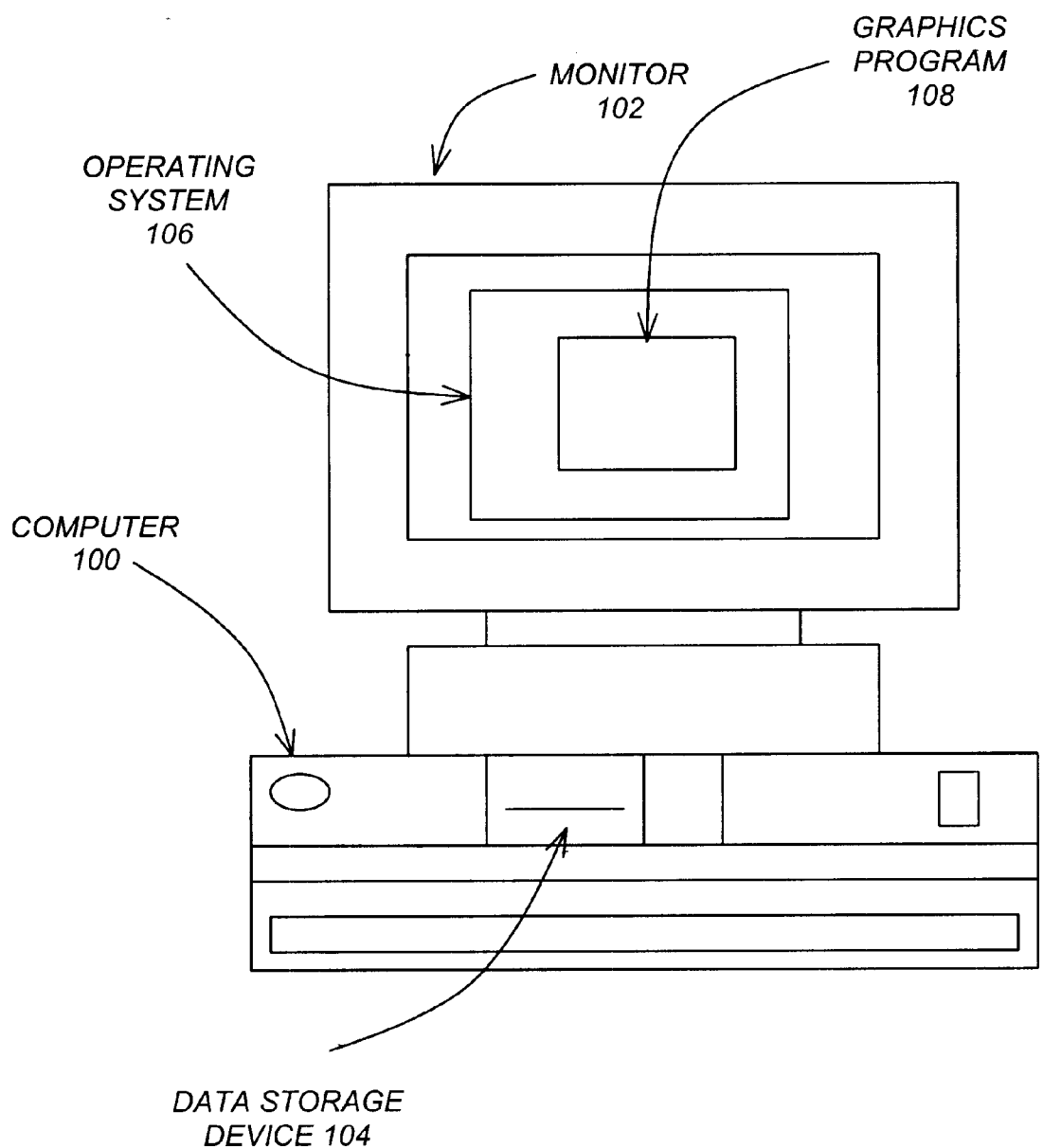
FIG. 1 is an exemplary hardware and software environment used to implement one or more embodiments of the invention.

FIG. 1 is an exemplary hardware and software environment used to implement one or more embodiments of the invention. Embodiments are typically implemented using a computer 100, which generally includes, inter alia, a monitor 102, data storage devices 104, and other devices. Those skilled in the art will recognize that any combination of the above components, or any number of different components, peripherals, and other devices, may be used with the computer 100.

The computer 100 usually operates under the control of an operating system 106, which is represented by a window displayed on the monitor 102. One or more embodiments of the invention are implemented by a computer-implemented graphics program 108 that operates under the control of the operating system 106, wherein the graphics program 108 is also represented by a window displayed on the monitor 102.

Generally, the operating system 106 and graphics program 108 comprise logic and/or data embodied in or readable from a device, media, or carrier, e.g., one or more fixed and/or removable data storage devices 104 connected directly or indirectly to the computer 100, one or more remote devices coupled to the computer 100 via data communications devices, etc.

Those skilled in the art will recognize that the exemplary environment illustrated in FIG. 1 is not intended to limit the present invention. Indeed, those skilled in the art will recognize that other alternative environments may be used without departing from the scope of the present invention.

Computer-Implemented Graphics Program

Figure 2:
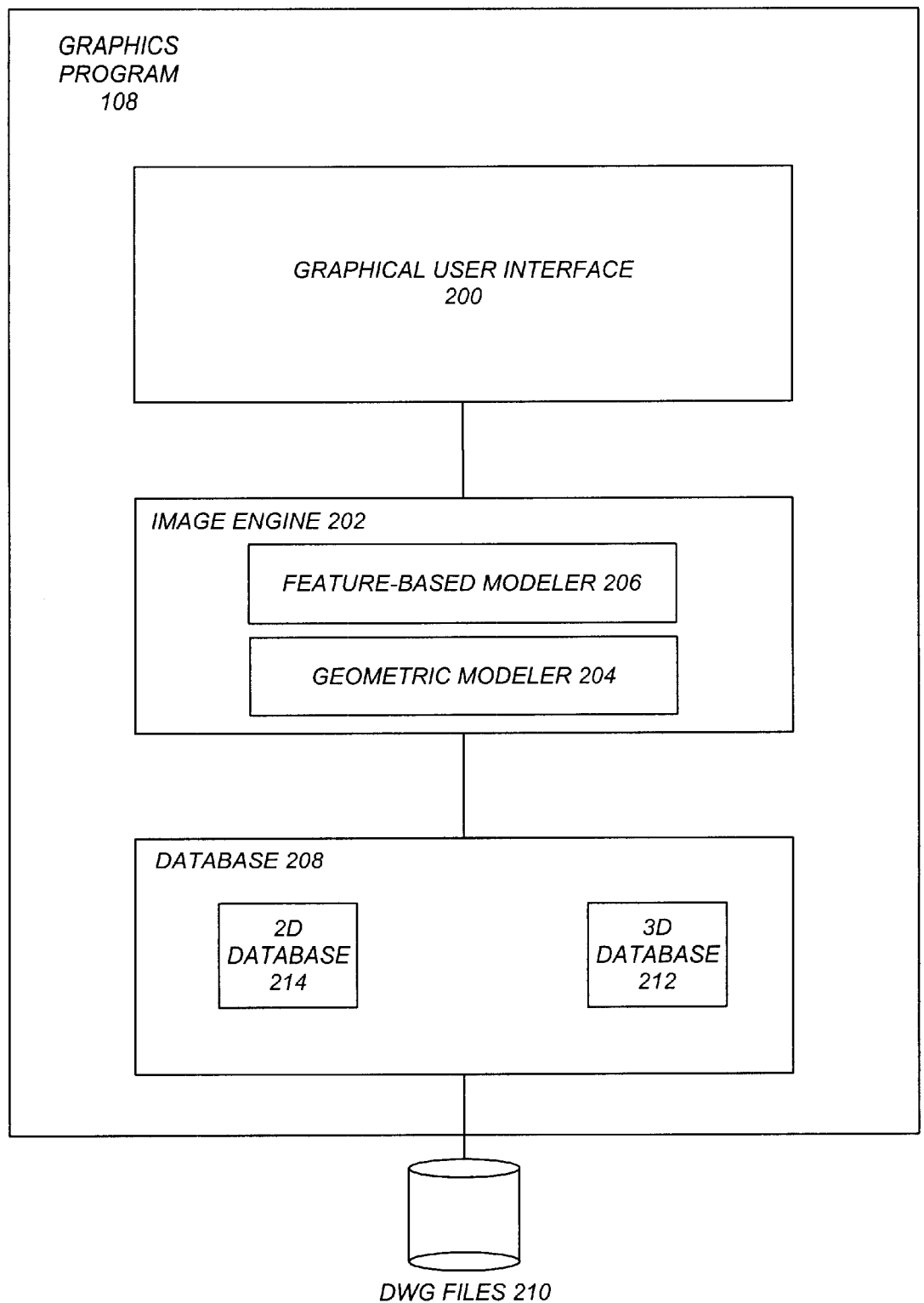
FIG. 2 is a block diagram that illustrates the components of the graphics program in accordance with one or more embodiments of the invention.

FIG. 2 is a block diagram that illustrates the components of the graphics program 108 in accordance with one or more embodiments of the invention. There are three main components to the graphics program 108, including: a Graphical User Interface (GUI) 200, an Image Engine (IME) 202 including a Geometric Modeler (GM) 204 and Feature-Based Modeler (FM) 206, and a database (DB) 208 for storing objects in Drawing (DWG) files 210.

The Graphical User Interface 200 displays information to the user and provides the functionality for the user's interaction with the graphics program 108.

The Image Engine 202 processes the Database 208 or DWG files 210 and delivers the resulting graphics to an output device. In one or more embodiments, the Image Engine 202 provides a complete application programming interface (API) that allows other computer programs to interface to the graphics program 108 as needed.

The Geometric Modeler 204 primarily creates geometry and topology for models. The Feature-Based Modeler 206, which interacts with the Geometric Modeler 204, is a parametric feature-based solid modeler that integrates 2D and 3D mechanical design tools, including parametric assembly modeling, surface modeling, 2D design, and associative drafting. The Feature-Based Modeler 206 provides powerful solid-, surface-, and assembly-modeling functionality.

The Database 208 is comprised of two separate types of databases: (1) a 3D database 212 known as the "world space" that stores 3D information; and (2) one or more 2D databases 214 known as the "virtual spaces" or "view ports" that stores 2D information derived from the 3D information. The 3D database 212 captures the design intent and behavior of a component in a model.

Object Structure

Figure 3:
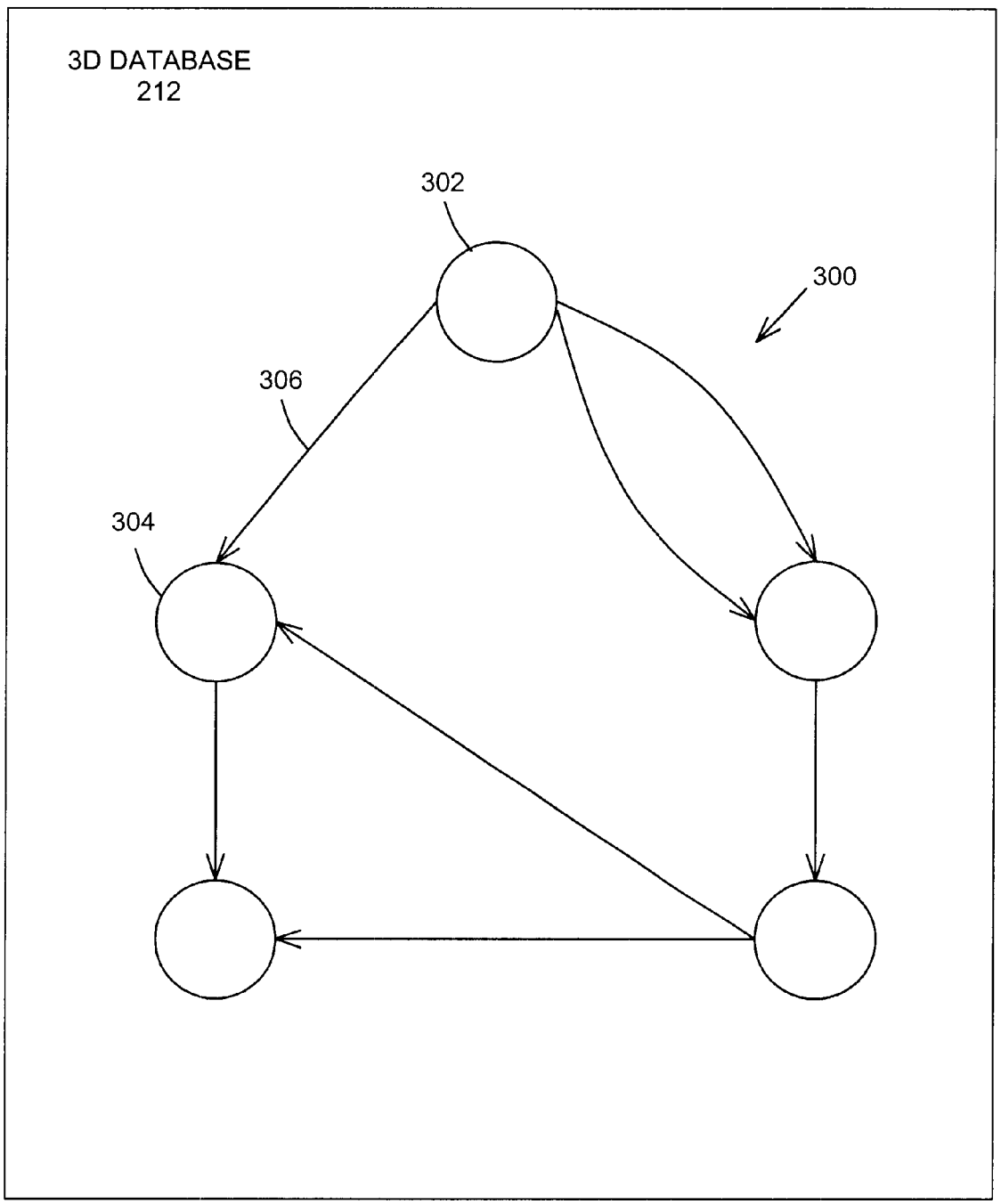
FIG. 3 is a block diagram that illustrates an object structure maintained by a 3D database in accordance with one or more embodiments of the invention.

FIG. 3 is a block diagram that illustrates an object structure 300 maintained by the 3D database 212 in accordance with one or more embodiments of the invention. Each object structure 300 includes a header node 302 and usually includes one or more nodes 304 connected by zero or more edges 306. There may be any number of different object structures 300 maintained by the 3D database 212. Moreover, a node 304 may be a member of multiple structures 300 in the 3D database 212.

Bridge Node

To illustrate the derivation of parts, a part history graph (also referred to as a dependency graph) may be maintained, accessed, and examined. A part history graph is a recipe for recreating a part. The part history graph contains a set of computations that may be utilized to recreate part(s) and the ordering to be utilized in the recreation process. Sophisticated software is used to traverse a part history graph and rebuild the part. A part history graph is binary data, but can be exported textually and/or interpreted and displayed graphically. In graphical representations of part history graphs, box-shaped nodes are user-created features and ellipse-shaped nodes are other internally created objects. Solid arrows represent direct connections between nodes (these links are always traversed when identifying feature dependencies). Dashed arrows with labels are edge connections, secondary connections that are selectively traversed when following dependencies. "FO" links are feature-ordering edges, identifying the order within which construction features are computed (referred to as the compute order). A compute order ensures that construction features will always be computed in the order they were introduced, even in the absence of other dependencies (so that the boundary representation is correct when the feature is computed).

Figure 4:
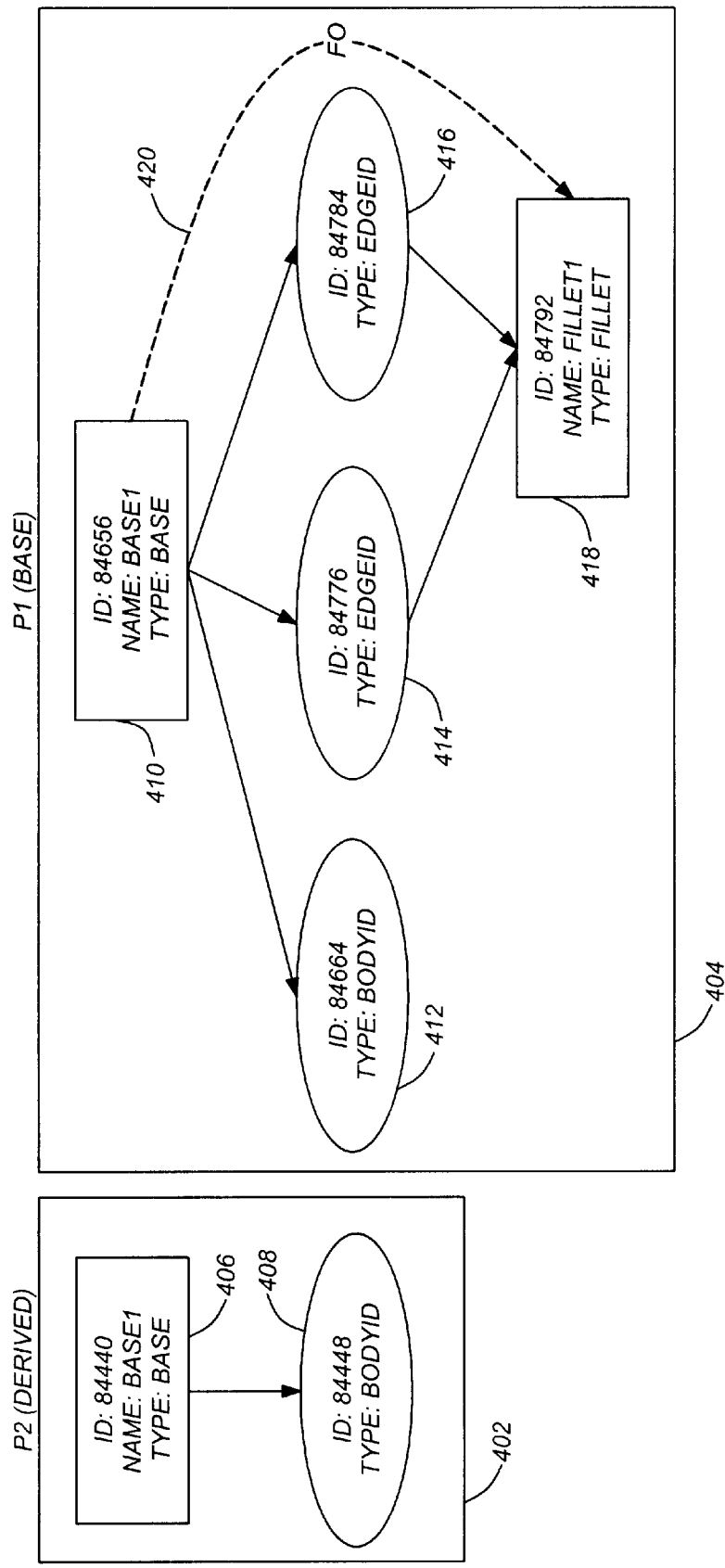
FIG. 4 illustrates a part history graph for a base part and a derived part.

For example, assume a part P2 is just a solid, and another part P1 (a base part) is a solid with a pair of filleted edges. A filleted edge is a curved transition from one part face or surface to another (e.g., a curved/rounded corner). FIG. 4 illustrates the part history graph for such an example. As illustrated, base part P1 404 is identified by a base object 410 that contains a body 412, and two edges 414–416 that are connected using a fillet 418. Further, the base object 410 is computed prior to the fillet 418 as indicated by the dashed feature-ordered edge 420.

Figure 5:
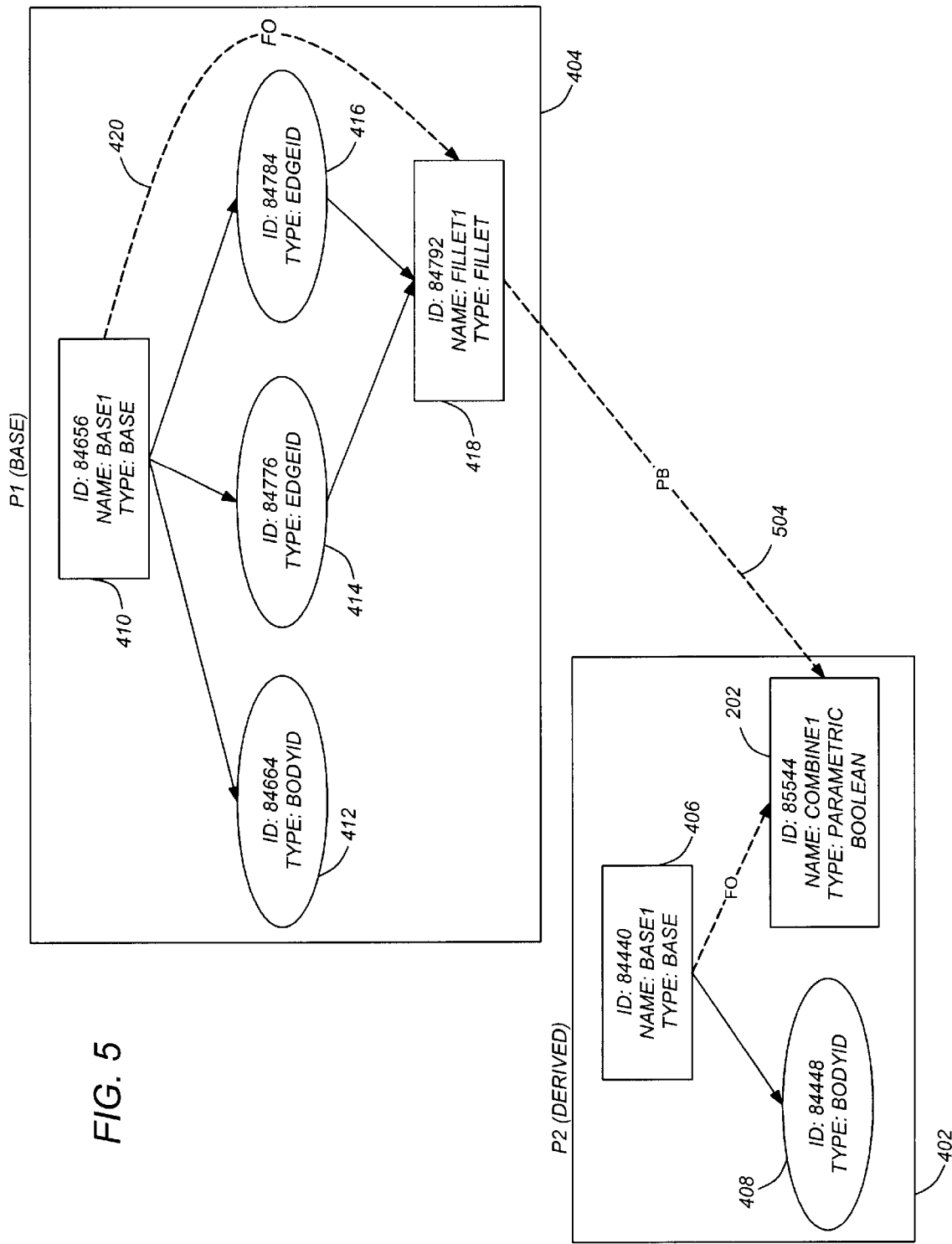
FIG. 5 illustrates a part history graph wherein a base part and a derived part are combined.

If P1 404 were to be combined with P2 402, the derivation relationship would be represented in the part histories as illustrated in FIG. 5. A connection 504 (labeled "PB") is made between fillet1 418 on P1 404 and a combine1 object 202 on P2. The connection 504 between combine1 object 202 and fillet1 object 418 indicates that whenever the base P1 404 is recomputed, the dependent features on the derived part P2 402 must also be recomputed.

Figure 6:
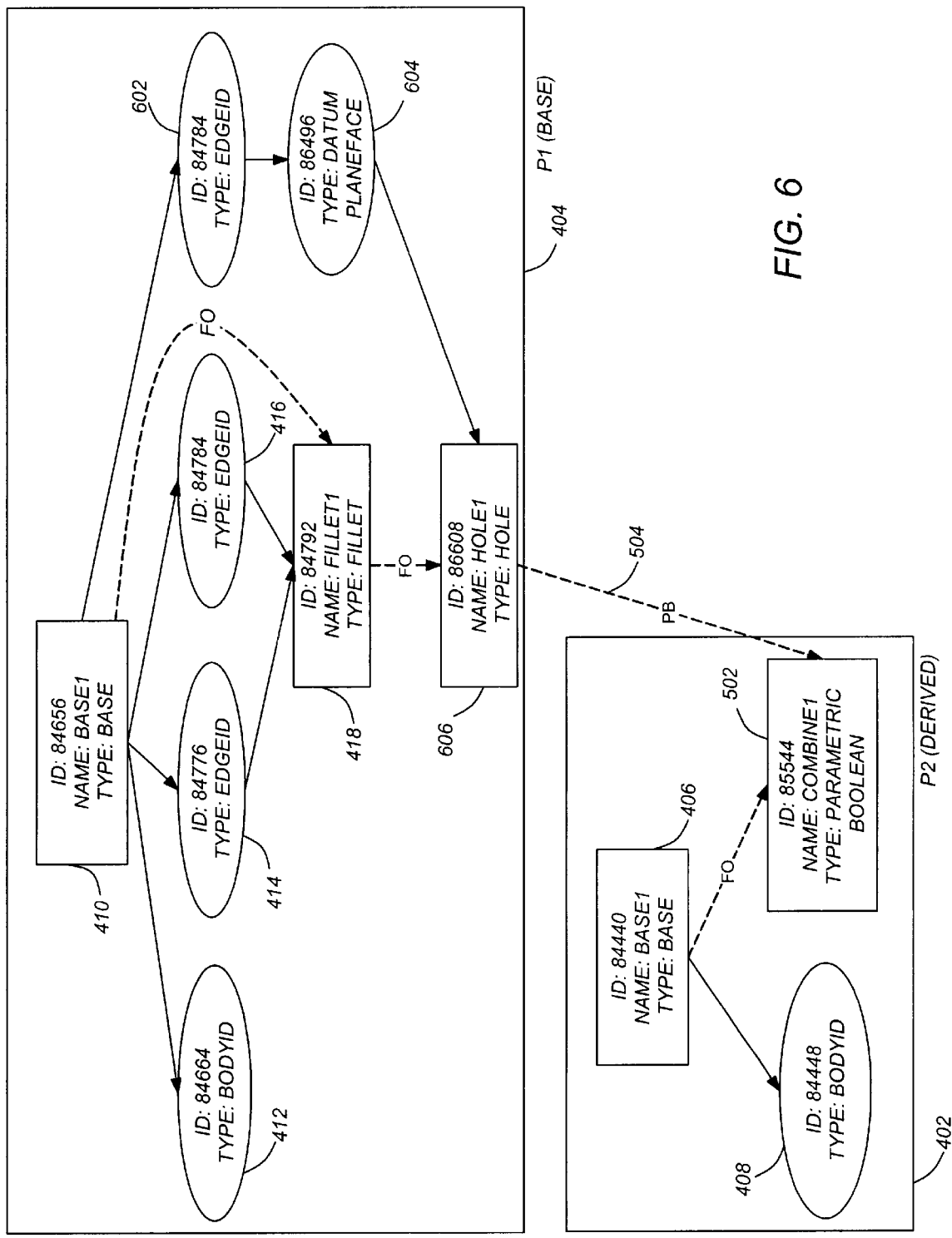
FIG. 6 illustrates a part history graph wherein a connection is relocated upon the addition of a feature to a base part.

A derived part 402 always uses the finished body of its base part(s) 404. Therefore, as features are added to or removed from P1 404, the connection 504 to P2 402 must be moved so that it emanates from the last construction feature on P1 404 as illustrated in FIG. 6. In FIG. 6, an additional edge 602 is added to P1 404 that has a datum feature 604 that may reflect the location of a new hole1 606. The last construction feature on P1 404 is hole1 606. Accordingly, the connection 504 to P2 is moved such that it emanates from hole1 606. The last construction feature on any part may be designated as the bridge node for that part (it serves as the bridge to derived parts).

When a particular feature such as edges 414, 416, or 602, fillet1 418, hole1 606, or datum 604 is suppressed, the location of the connections 420 and 504 are not affected. In other words, it doesn't matter if the last construction feature actually computes when following dependencies. If there is no construction feature to which to attach a parametric boolean connection 504 in the case where all features have been stripped from a toolbody part, then the toolbody part has no volume, and all parametric boolean features that reference it must be deleted.

In addition to knowing when dependent features on derived parts 402 need to be recomputed due to changes on a base part 404, knowledge of when dependent features need to be deleted or excluded is useful. Two paradigms may be utilized in approaching features that should be excluded (referred to as feature exclusions). The first paradigm is exclusion for efficiency. The second paradigm is exclusion for modeling.

If a feature is excluded for efficiency, the feature is excluded to make viewing and working with non-excluded nodes/features more efficient. In other words, one or more features unrelated to the current modeling area of interest are excluded as a way of decreasing model update time, or removing screen clutter when working in wireframe mode. Such nodes are designated "compute-suppressed" or just "suppressed". Whether a node has any features of a specified exclusion status is referred to as the node's disjunctive exclusion status. For example, a node has a disjunctive exclusion status of suppressed if any feature of the node is suppressed. To decrease memory usage, it is also possible to unload a non-local part (or the database maintaining the non-local part) from memory. All features of an unloaded part are considered to be suppressed. With suppressed nodes, the design intent is to preserve the integrity of suppressed features, on the assumption that they will be unsuppressed at some point in time.

If a feature is excluded for modeling, the feature is excluded as a way of differentiating between different versions of a part. In other words, various versions of a part may utilize different features. To distinguish the different versions, a feature may or may not be excluded. Features that have been excluded for modeling are designated as "versioned" and are treated as if they are not in the model. Additionally, versioned nodes cannot be individually unsuppressed by the user, only as a side effect of switching part versions.

Suppressed or versioned nodes are collectively referred to as "excluded" nodes, and whether a node is suppressed or versioned is known as the node's primary or disjunctive exclusion status. Excluded nodes may also be distinguished based on their dependency. A node is compute-excluded if the node is excluded as a dependent of other nodes on the same part. A node is combine-excluded when the nodes on a derived part 402 are excluded as dependents of excluded nodes on one or more of its base parts 404. Excluded nodes that are neither compute-exclude nor combine-excluded are user-excluded. Whether a node is combine-excluded or compute-excluded is referred to as the node's secondary exclusion status. Further, as described above, whenever a base part 404 contains any feature that has been excluded, the base part's disjunctive exclusion status is excluded/suppressed.

To support non-local or non-native parts, a scheme is needed to maintain cross-part dependencies without modifying the base part 404, and to ensure these dependencies get chased when either the reference to a non-native part is refreshed/recomputed, or an editing session on a non-native part is completed.

When a reference is to a part across a dependency graph (i.e., to a non-local or non-native part), the reference is referred to as a cross reference (XREF). When accessing or identifying a base part 404 or derived part 402, a dependency identification (DepId) may be utilized that uniquely identified any part 402–404. When a cross XREF is utilized, the connection 504 between a base part 404 and a derived part 402 is not permitted to span across different dependency graphs. Consequently, a DepId created for a Geom Ref to an XREF part is sometimes referred to as an orphaned DepId.

A XREF part is orphaned in the sense that the XREF part has no predecessors or successors. Although geometry for a 3D constraint is represented in a dependency graph, the XREF part has no successors because it only has external dependents (since the constraint relationship between the parts is not expressed). The XREF part has no predecessors because it cannot be connected to its referenced features because such a connection 504 would cross dependency graph boundaries.

Figure 7:
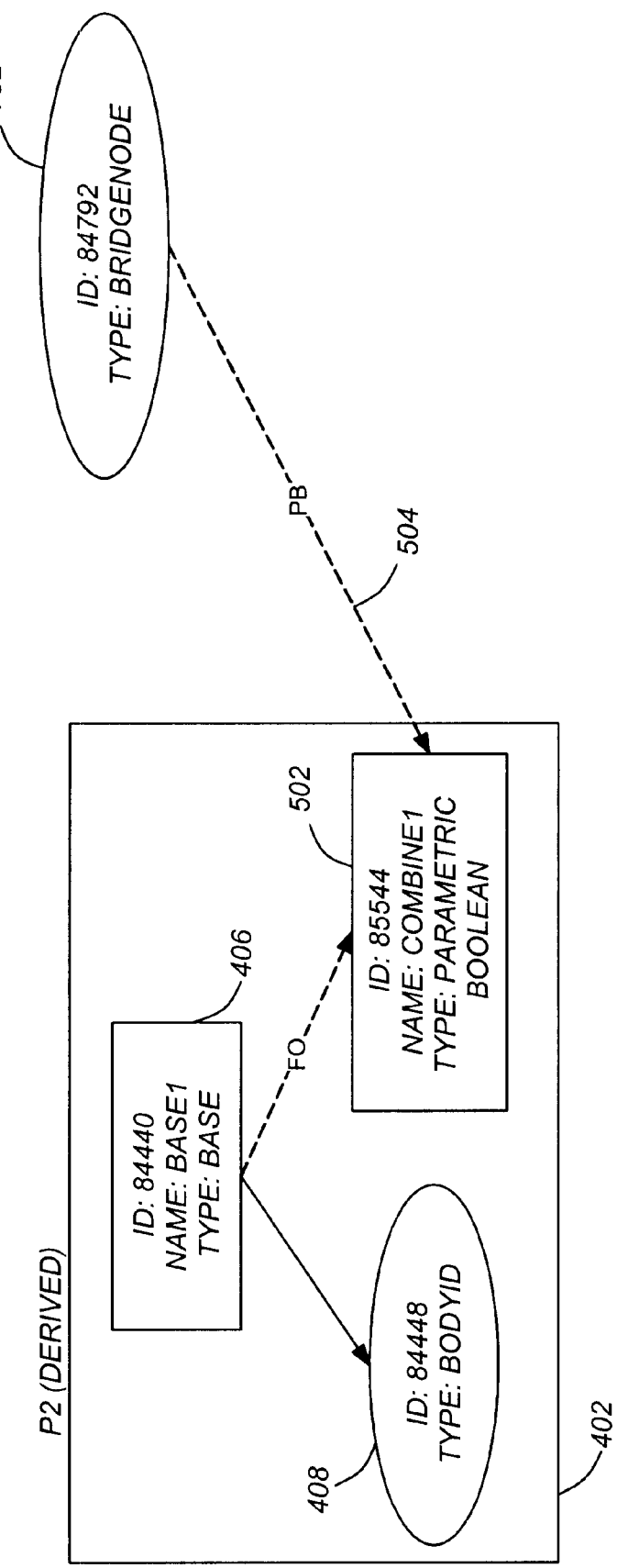
FIG. 7 illustrates a part history graph wherein a bridge node is utilized in accordance with one or more embodiments of the invention.

The exclusion status of orphaned DepIds is refreshed each time the relevant XREF part is loaded or reloaded, and otherwise never needs to be computed. If the XREF part is localized, the orphaned DepId can be reconnected to its referenced feature(s) on the part 402–404. To support non-native or non-local toolbodies, a node similar to an orphaned DepId, referred to as a bridge node, can be created to carry a reference to the base part 404 and to hold the derived part 402 edge orderings in lieu of modifying the base part 404 itself. FIG. 7 illustrates the use of a bridge node in accordance with one or more embodiments of the invention. As illustrated, bridge node 702 is utilized to provide the connection 504 to the combine1 object 502 of the derived part P2 402. Further, the bridge node 702 also maintains a reference to the base part 404.

A bridge node 702 is queued for update whenever the relevant XREF is found to be out of date with respect to the host drawing/base part 404. For example, when a host drawing/base part 404 is loaded, or whenever the XREF is reloaded, the bridge node 702 is queued for update. Updating the bridge node 702 ensures that dependent local features are also recomputed. When a local part P is externalized (i.e., when part P is no longer maintained locally and/or is represented by an orphaned DepId), a bridge node 702 for P is created, and the parametric boolean edge orderings are transferred from the last construction feature on P to the new bridge node 702. Upon localization of P, the process is reversed, parametric boolean edge orderings are transferred back from the bridge node to the last construction feature on P, and the bridge node is erased.

In addition, bridge node 702 is a perfect surrogate for the base part 404 it represents. If the exclusion status for any features 412–418 and 602–606 on the base part 404 are in an excluded or suppressed state, "suppressing" the bridge node 702 for that part will bring the exclusion status of all dependent features into the proper exclusion state. Accordingly, the base part's 404 disjunctive exclusion status is utilized to update the remaining features 412–418 and 602–606 and the brige node 702. Further, the base part's 404 disjunctive exclusion status depends on whether any feature 412–418 and 602–606 is of a given exclusion status. Because the exclusion status of dependent features are tagged as combine-excluded by this process, this secondary exclusion status can be used in the update process to identify features that might be unsuppressed when changes to the non-local or non-native base part 404 are detected.

Update Process

The update process is executed whenever a single external database is reloaded or refreshed, and is also executed at drawing load time for all databases which are determined to be "newer" than the host drawing. To determine when a database is "newer" than the host drawing is, an internal timestamp may be compared to a file timestamp.

Figure 8:
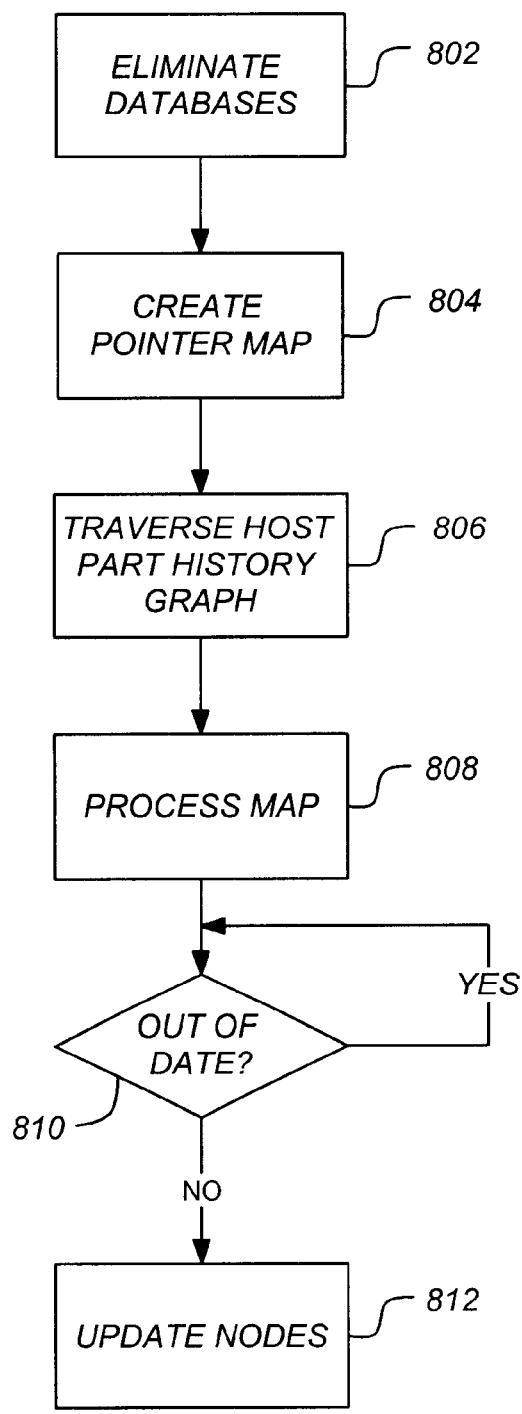
FIG. 8 illustrates the update process in accordance with one or more embodiments of the invention.

In the update process, relevant nodes are identified, flagged for update, and updated so that all of the nodes and the model reflect the most recent change in a database, another relevant node, or a drawing. FIG. 8 illustrates the update process in accordance with one or more embodiments of the invention. At step 802, databases (e.g., AutoCAD™ databases) that were created by incompatible application versions (e.g., versions of Mechanical Desktop™ databases prior to version 3) or alternate applications (e.g., applications other than Mechanical Desktop™) are eliminated from consideration. Such databases are eliminated from consideration since necessary information within such databases may not be available. For example, databases created by Mechanical Desktop™ applications provide essential services such as extended protocols that serve as wrappers around non-native parts, emulating certain behaviors of native parts. Non-Mechanical Desktop™ applications may lack such essential services.

At step 804, a pointer map is created for the databases that have not been eliminated. The pointer map is indexed by database ID for each of the databases. Each database ID provides access to a record comprising a new/empty database reference array that will contain the dependent nodes maintained in each database. FIG. 9 illustrates the pointer map in accordance with one or more embodiments of the invention. Each row of the map represents a database and an array of references/pointers to each node in the database. Accordingly, the pointer map contains the databases (and the nodes within each database) that need to be updated.

At step 806, the set of nodes in a host part 404 history graph is traversed. For each XREF node in the graph that references a database ID in the pointer map, the node is added to the corresponding array in the pointer map. Accordingly, the nodes (or references to the nodes) that are within a database that is to be updated are placed into the pointer map to be updated.

At step 808 the pointer map is processed. For each database/row in the map, the array of nodes is processed. To flag/schedule the relevant nodes to be refreshed, the update process ensures that the appropriate state is set for each node. Accordingly, for each XREF node in each array, a refresh method is called. The refresh method for a bridge node 702 ensures that the state of the node 702 is configured to be "out of date".

The refresh method first tests to see whether a dependency manager for the node 702 is configured to be "out of date". If not, the dependency manager is reconfigured to an "out of date" state. The bridge node 702 is then queued for update. No further processing is performed until the "out of date state" is removed. Accordingly, at step 810, a determination is made as to whether or not any nodes are in an "out of date" state. Once all nodes have been processed and are not out of date, the nodes in the update queue are updated at step 812. Updating the nodes forces the recomputation of all parametric boolean that use the nodes as toolbodies, as well as all dependent non-suppressed features. Additionally, the model itself may be updated.

The "out of date" state is intended to be transient. The dependency manager is forced into this state when a bridge node 702 determines that its non-local or non-native source body (e.g., a non-native derived part 402) has changed since the last time the host drawing (and/or the relevant base part 404) was read. While orphan DepIds for XREF parts may also determine that the host drawing is "out-of-date" with respect to their part, each DepId can be updated efficiently in isolation (i.e., by updating the appropriate corresponding bridge node 702). By introducing the "out of date" state during a file/host drawing open operation or XREF refresh operation, the update process is centralized. Such centralization addresses combined parts with non-local or non-native toolbodies and may address updating assembly features as well.

To remove the "out of date" state from a node/dependency manager, a remove "out of date" process/method (referred to as remove process) may be utilized. The remove process may be invoked when a drawing has completed loading or when edits to a part are complete (e.g., by receiving a notification from a part editor that has completed any edits/modifications to a part).

While the dependency manager is in the "out of date" state, various objects may be maintained and various actions/processes may occur. Accordingly, an "out of date" object maintains a local array of changed nodes (referred to as changed node array). Each node in the changed node array represents a non-local or non-native part that has undergone some change(s) since the last time the host drawing was read. Nodes are added to the changed node array by examining the nodes in the pointer map to determine which nodes have changed. Once identified, the changed node (or a reference to the changed node) is added to the changed node array. The remove process determines the effect of the changes, in terms of the node's disjunctive exclusion status, features that may be unsuppressed, features that may have to be suppressed or versioned, and features that need to be recomputed and removes the "out of date" state.

Figure 10:
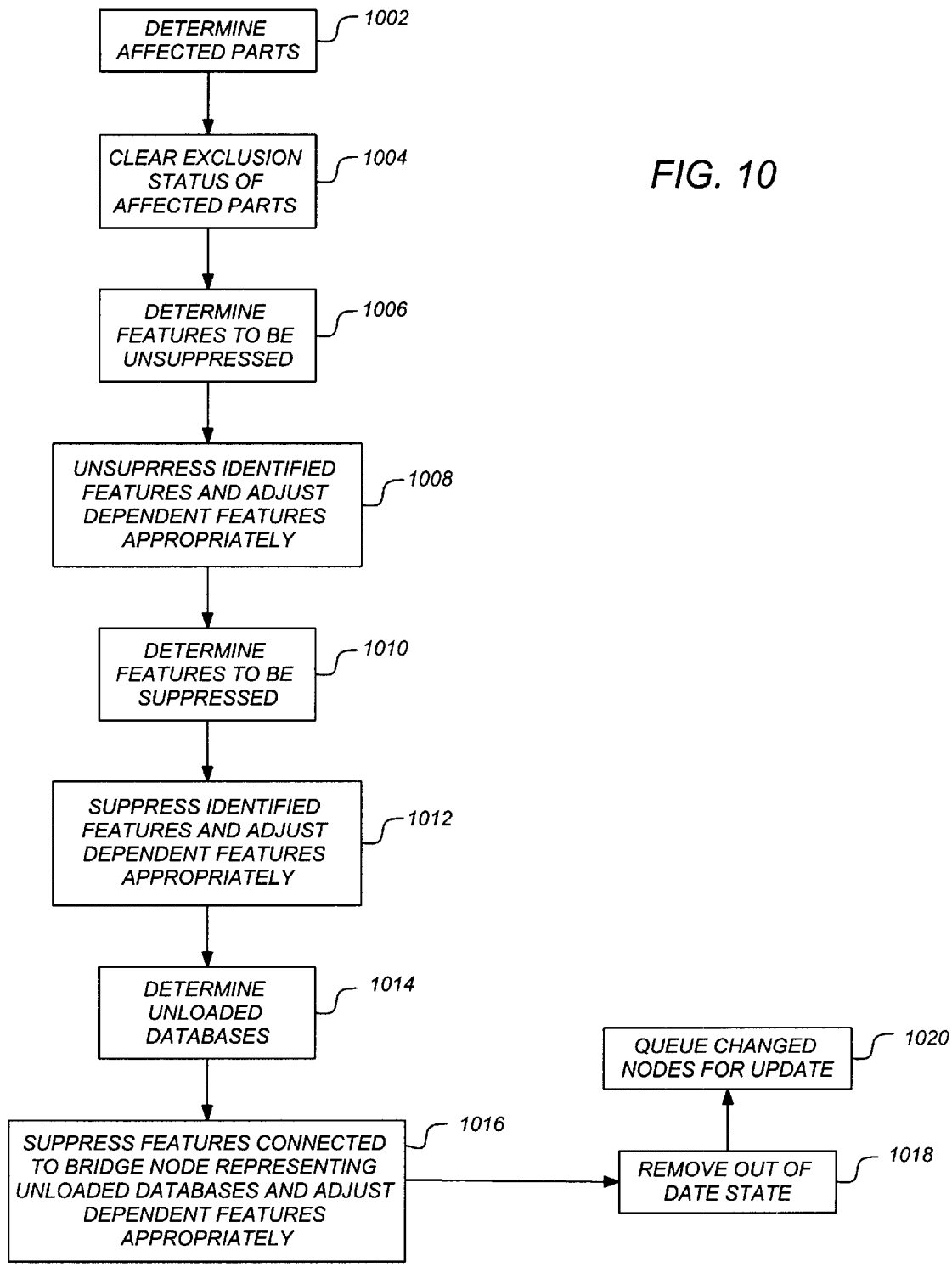
FIG. 10 is a flow chart illustrating the actions taken by the remove process.

FIG. 10 is a flow chart illustrating the actions taken by the remove process. At step 1002, the originating parts for source/base parts 404 and the set of affected parts (i.e., those nodes that are dependent on the node in the changed node array) are determined. To accomplish these tasks, the changed node array is traversed. When traversing the changed node array, an originating part array is populated with the source/base parts 404. To determine the set of affected parts, the parametric boolean ordering edges of each node are chased/followed to obtain the parts that are affected by the change/modification in the changed node. For the nodes that have been modified, the node's disjunctive exclusion status is cleared at step 1004.

At step 1004, the features for each node that are to be unsuppressed are determined (i.e., those nodes that were previously suppressed but as a result of the changes to the part are no longer suppressed). To determine the affected parts that have features that need to be unsuppressed, the disjunctive exclusion status of each affected part is examined to obtain the affected parts that have an disjunctive exclusion status that is suppressed, i.e., parts that have combine excluded features (i.e., those features that are suppressed as the dependent of a suppressed feature on one of its toolbodies). For each part that has a combine excluded disjunctive exclusion status (i.e., each part that has any combine-excluded feature), the toolbody set for the part is obtained. Any part in the toolbody set that is also a part in the originating part array is added to a set of excluded parts. Accordingly, the set of excluded parts contains non-local or non-native toolbody parts that may contain predecessors of the combine-excluded features. For each part in the excluded part set, the corresponding bridge node 702 in the changed node array is located and the exclusion status of the bridge node 702 is set to suppressed.

At step 1008, the identified bridge nodes 702 (i.e., those nodes with a suppressed exclusion status) are unsuppressed. While unsuppressing the bridge nodes 702, dependent features that can also be unsuppressed and any dependent features that either must now be suppressed or must stay suppressed are determined. The exclusion status of these nodes may also be adjusted as appropriate.

At step 1010, the features that need to be suppressed are determined. To make this determination, the changed node array is traversed and each bridge node 702 is examined to determine whether the bridge node 702 is connected to any excluded nodes (by examining the disjunctive exclusion status of the nodes). For each bridge node 702 that contains any excluded nodes, the exclusion status of the bridge node 702 is set to suppressed and the bridge node 702 is added to an array of input nodes. If the bridge node 702 does not contain any excluded nodes, the exclusion status of the bridge node 702 is cleared. At step 1012, the bridge nodes 702 in the input nodes array and any dependents are suppressed.

At step 1014 databases that have been unloaded from memory, if any, are determined. For all bridge nodes representing unloaded databases, all features connected to the bridge node via edge ordering connections are suppressed, and then all dependents of those features are suppressed recursively at step 1016.

Upon completing step 1016, all of the nodes have been updated. Accordingly, at step 1018 the out of date state is removed for all of the nodes. At step 1020, the nodes in the changed node array are queued for update. As described above, when the update queue is processed (at step 812), all of the parametric boolean which use the parts as toolbodies are forced to recompute. Additionally, all dependent non-suppressed features are recomputed.

Conclusion

This concludes the description of one or more embodiments of the invention. The following describes some alternative embodiments for accomplishing the present invention. For example, any type of computer, such as a mainframe, minicomputer, work station or personal computer, could be used with the present invention. In addition, any program, function, or system providing functions for updating features in a solid modeling system could benefit from the present invention.

In summary, the present invention discloses a computer-implemented method, apparatus, and article of manufacture for updating a host drawing and features contained within the host drawing. A bridge node is utilized to support non-local or non-native base parts and to maintain cross-part dependencies without modifying a base part. Any node that has changed since the last time the drawing hosting the node was loaded or when a node's parent/base node has changed, is updated. Accordingly, a node may be recomputed, or features of a node may be suppressed or unsuppressed based on the changes in the node or a related node.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for updating a drawing in a computer-implemented solid modeling system comprising:
   (a) maintaining a non-local or non-native base part having one or more features in a host drawing of the computer implemented solid modeling system;
   (b) maintaining one or more derived parts dependent on a feature of the base part in the host drawing;

(c) maintaining a part history graph for local and native base parts of the host drawing comprising a set of computations and orderings that may be utilized to recreate the base parts and the one or more derived parts of the host drawing;

(d) creating a bridge node for the base part in the part history graph, wherein the bridge node maintains one or more edge ordering connections between the base part and the one or more derived parts;

(e) determining a disjunctive exclusion status of the base part;

(f) updating the exclusion status of the bridge node for the base part to match the disjunctive exclusion status of the base part;

(g) updating an exclusion status of dependent features on one or more derived parts to match the exclusion status of the bridge node; and (h) updating the host drawing utilizing the disjunctive exclusion status of the one or more features of the base part and the exclusion status of the one or more derived parts to account for the relevant features of the base part and the one or more derived parts.

2. A method for updating a drawing in a computer-implemented solid modeling system, comprising:

(a) creating a bridge node, wherein the bridge node maintains a reference to a base part and holds a derived part edge ordering;

(b) determining when a drawing needs to updated;

(c) determining a disjunctive exclusion status of the base part;

(d) updating the exclusion status of the bridge node based on the disjunctive exclusion status of the base part;

(e) updating the exclusion status of dependent features on one or more derived parts based on the exclusion status of the bridge node; and (f) updating the host drawing utilizing the exclusion status of the base part and the derived part.

3. The method of claim 2 wherein the base part is a non-native part.

4. The method of claim 2 wherein the base part is a non-local part.

5. The method of claim 2 wherein the bridge node is created without modifying the base part.

6. The method of claim 2 wherein the determining comprises determining if the base part has been modified since the last time the host drawing was read.

7. The method of claim 2 wherein:

the disjunctive exclusion status of the base part provides that one or more features on the base part are suppressed;

the exclusion status of the bridge node is updated to suppressed; and the exclusion status of dependent features on one or more derived parts is updated to suppressed.

8. The method of claim 2 wherein:

the disjunctive exclusion status of the base part provides that one or more features on the base part are versioned;

the exclusion status of the bridge node is updated to versioned; and the exclusion status of dependent features on one or more derived parts is updated to versioned.

9. The method of claim 2 wherein:

a current exclusion status of the bridge node indicates that features on the base part were formerly suppressed, and the disjunctive exclusion status of the base part indicates that no features are currently suppressed;

the exclusion status of the bridge node is updated to unsuppressed;

it is determined that there are dependent features on derived parts whose primary exclusion status is suppressed and whose secondary exclusion status is combine-excluded; and the exclusion status of dependent features on one or more derived parts is updated to unsuppressed.

10. The system of claim 9 wherein the base part is a non-native part.

11. The system of claim 9 wherein the base part is a non-local part.

12. The system of claim 9 wherein the bridge node is created without modifying the base part.

13. The system of claim 9 wherein the determining comprises determining if the base part has been modified since the last time the host drawing was read.

14. The system of claim 9 wherein:

the disjunctive exclusion status of the base part provides that one or more features on the base part are suppressed;

the exclusion status of the bridge node is updated to suppressed; and the exclusion status of dependent features on one or more derived parts is updated to suppressed.

15. The system of claim 9 wherein:

the disjunctive exclusion status of the base part provides that one or more features of the base part are versioned;

the exclusion status of the bridge node is updated to versioned; and the exclusion status of dependent features on one or more derived parts is updated to versioned.

16. The system of claim 9 wherein:

a current exclusion status of the bridge node indicates that features on the base part were formerly suppressed, and the disjunctive exclusion status of the base part indicates that no features are currently suppressed;

the exclusion status of the bridge node is updated to unsuppressed;

it is determined that there are dependent features on derived parts whose primary exclusion status is suppressed and whose secondary exclusion status is combine-excluded; and the exclusion status of dependent features on one or more derived parts is updated to unsuppressed.

17. The system of claim 9 wherein:

a current exclusion status of the bridge node indicates that features on the base part were formerly versioned, and the disjunctive exclusion status of the base part indicates that no features are currently versioned;

the exclusion status of the bridge node is updated to unsuppressed;

it is determined that there are dependent features on derived parts whose primary exclusion status is versioned and whose secondary exclusion status is combine-excluded; and the exclusion status of dependent features on one or more derived parts is updated to unsuppressed.

18. The system of claim 9, the logic further comprising:

determining if any databases represented by any bridge nodes have been unloaded from memory; and for all bridge nodes representing unloaded databases, suppressing all features connected to each bridge node via edge ordering connections, and their dependent features.

19. The method of claim 2 wherein:

a current exclusion status of the bridge node indicates that features on the base part were formerly versioned, and the disjunctive exclusion status of the base part indicates that no features are currently versioned;

the exclusion status of the bridge node is updated to unsuppressed;

it is determined that there are dependent features on derived parts whose primary exclusion status is versioned and whose secondary exclusion status is combine-excluded; and the exclusion status of dependent features on one or more derived parts is updated to unsuppressed.

20. The method of claim 2 further comprising:

determining if any databases represented by any bridge nodes have been unloaded from memory; and for all bridge nodes representing unloaded databases, suppressing all features connected to each bridge node via edge ordering connections, and their dependent features.

21. A computer-implemented graphics system, comprising:

(a) a computer; and (b) a feature-based modeler, executed by the computer, having logic for:

(1) creating a bridge node, wherein the bridge node maintains a reference to a base part and holds a derived part edge ordering;

(2) determining when a drawing needs to updated;

(3) determining a disjunctive exclusion status of the base part;

(4) updating the exclusion status of the bridge node based on the disjunctive exclusion status of the base part;

(5) updating the exclusion status of dependent features on one or more derived parts based on the exclusion status of the bridge node; and (6) updating the host drawing utilizing the exclusion status of the base part and the derived part.

22. An article of manufacture embodying logic for updating a drawing in a computer-implemented solid modeling system, the logic comprising:

(a) creating a bridge node, wherein the bridge node maintains a reference to a base part and holds a derived part edge ordering;

(b) determining when a drawing needs to updated;

(c) determining a disjunctive exclusion status of the base part;

(d) updating the exclusion status of the bridge node based on the disjunctive exclusion status of the base part;

(e) updating the exclusion status of dependent features on one or more derived parts based on the exclusion status of the bridge node; and (f) updating the host drawing utilizing the exclusion status of the base part and the derived part.

23. The article of manufacture of claim 22 wherein the base part is a non-native part.

24. The article of manufacture of claim 22 wherein the base part is a non-local part.

25. The article of manufacture of claim 22 wherein the bridge node is created without modifying the base part.

26. The article of manufacture of claim 22 wherein the determining comprises determining if the base part has been modified since the last time the host drawing was read.

27. The article of manufacture of claim 22 wherein:

the disjunctive exclusion status of the base part provides that one or more features on the base part are suppressed;

the exclusion status of the bridge node is updated to suppressed; and the exclusion status of dependent features on one or more derived parts is updated to suppressed.

28. The article of manufacture of claim 22 wherein:

the disjunctive exclusion status of the base part provides that one or more features on the base part are versioned;

the exclusion status of the bridge node is updated to versioned; and the exclusion status of dependent features on one or more derived parts is updated to versioned.

29. The article of manufacture of claim 22 wherein:

a current exclusion status of the bridge node indicates that features on the base part were formerly suppressed, and the disjunctive exclusion status of the base part indicates that no features are currently suppressed;

the exclusion status of the bridge node is updated to unsuppressed; and it is determined that there are dependent features on derived parts whose primary exclusion status is suppressed and whose secondary exclusion status is combine-excluded; and the exclusion status of dependent features on one or more derived parts is updated to unsuppressed.

30. The article of manufacture of claim 22 wherein:

a current exclusion status of the bridge node indicates that features on the base part were formerly versioned, and the disjunctive exclusion status of the base part indicates that no features are currently versioned;

the exclusion status of the bridge node is updated to unsuppressed;

it is determined that there are dependent features on derived parts whose primary exclusion status is versioned and whose secondary exclusion status is combine-excluded; and the exclusion status of dependent features on one or more derived parts is updated to unsuppressed.

31. The article of manufacture of claim 22, the logic further comprising:

determining if any databases represented by any bridge nodes have been unloaded from memory; and for all bridge nodes representing unloaded databases, suppressing all features connected to each bridge node via edge ordering connections, and their dependent features.

* * * * *